United States Patent
Tsunomura et al.

(10) Patent No.: US 9,748,413 B2
(45) Date of Patent: Aug. 29, 2017

(54) SOLAR CELL MODULE

(75) Inventors: Yasufumi Tsunomura, Kobe (JP); Yukihiro Yoshimine, Kobe (JP); Shigeyuki Okamoto, Kobe (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 753 days.

(21) Appl. No.: 12/442,720

(22) PCT Filed: Sep. 19, 2007

(86) PCT No.: PCT/JP2007/068201
§ 371 (c)(1),
(2), (4) Date: Apr. 29, 2009

(87) PCT Pub. No.: WO2008/041487
PCT Pub. Date: Apr. 10, 2008

(65) Prior Publication Data
US 2010/0084001 A1   Apr. 8, 2010

(30) Foreign Application Priority Data

Sep. 28, 2006 (JP) .............................. P2006-265871

(51) Int. Cl.
| | |
|---|---|
| *H01L 31/00* | (2006.01) |
| *H01L 31/042* | (2014.01) |
| *H02N 6/00* | (2006.01) |
| *H01L 31/02* | (2006.01) |
| *H01L 31/0224* | (2006.01) |
| *H01L 31/05* | (2014.01) |
| *H01L 31/0747* | (2012.01) |

(52) U.S. Cl.
CPC .... *H01L 31/0201* (2013.01); *H01L 31/02013* (2013.01); *H01L 31/022425* (2013.01);
(Continued)

(58) Field of Classification Search
CPC ......... H01L 31/0201; H01L 31/02013; H01L 31/022425; H01L 31/042; H01L 31/048;
(Continued)

(56) References Cited

U.S. PATENT DOCUMENTS 4,590,327 A * 5/1986 Nath et al. ................ 136/256
5,084,107 A   1/1992 Deguchi et al.
(Continued)

FOREIGN PATENT DOCUMENTS

| EP | 0 710 991 A1 | 5/1996 |
| EP | 0 807 980 A2 | 11/1997 |

(Continued)

OTHER PUBLICATIONS

English machine translation of JP 2000-261012A.*

*Primary Examiner* — Lindsey Bernier
(74) *Attorney, Agent, or Firm* — McDermott Will & Emery LLP

(57) ABSTRACT

In a solar cell module, a plurality of solar cells are provided between a front surface protection member and a back surface protection member and bus bar electrodes 20 of the plurality of solar cells are electrically connected to each other by wiring members. The solar cell module includes an adhesive layer made of a resin 60 containing a plurality of conductive particles 70, the adhesive layer provided between each of the bus bar electrodes 20 and the wiring member 40. Each of the bus bar electrodes 20 and the corresponding wiring member 40 are electrically connected by the plurality of conductive particles 70. The resin 60 covers side surface of each of the bus bar electrodes 20 and configured to bond the wiring member 40 with the surface of a photoelectric conversion body 10.

10 Claims, 8 Drawing Sheets

(52) U.S. Cl.
CPC ...... *H01L 31/022433* (2013.01); *H01L 31/05* (2013.01); *H01L 31/0504* (2013.01); *H01L 31/0508* (2013.01); *H01L 31/0512* (2013.01); *H01L 31/0747* (2013.01); *Y02E 10/50* (2013.01)

(58) Field of Classification Search
CPC ........ H01L 31/05–31/0512; H01L 31/022433; Y02E 10/50
USPC ................................................ 136/244, 256
See application file for complete search history.

(56) References Cited

U.S. PATENT DOCUMENTS

| | | |
|---|---|---|
| 5,151,373 A | 9/1992 | Deguchi et al. |
| 2002/0016016 A1* | 2/2002 | Tsuzuki et al. ................. 438/57 |
| 2005/0115602 A1* | 6/2005 | Senta et al. ................... 136/250 |
| 2005/0199279 A1* | 9/2005 | Yoshimine et al. ........... 136/251 |
| 2006/0272844 A1* | 12/2006 | Berghofer et al. .......... 174/94 R |
| 2007/0095387 A1 | 5/2007 | Fujii et al. |
| 2008/0023069 A1* | 1/2008 | Terada .............. H01L 31/02167 136/256 |

FOREIGN PATENT DOCUMENTS

| | | |
|---|---|---|
| JP | 03-006867 A | 1/1991 |
| JP | 06-196743 A | 7/1994 |
| JP | H11204567 A | 7/1999 |
| JP | 2000-261012 A | 9/2000 |
| JP | 2001343903 A | 12/2001 |
| JP | 2002124754 A | 4/2002 |
| JP | 2002324429 A | 11/2002 |
| JP | 2005101519 A | 4/2005 |
| JP | 2005-217148 A | 8/2005 |
| JP | 2005252062 A | 9/2005 |
| JP | 2005317904 A | 11/2005 |
| JP | 3123842 U | 7/2006 |

* cited by examiner

SOLAR CELL MODULE

CROSS-REFERENCE TO RELATED APPLICATIONS

This application is the U.S. National Phase of PCT/JP2007/068201 filed Sep. 19, 2007, which claims priority to Japanese Patent Application No. 2006-265871 filed Sep. 28, 2006, the entire contents of each of which are incorporated herein by reference.

TECHNICAL FIELD

The present invention relates to a solar cell module in which a plurality of solar cells are arranged between a front surface protection member and a back surface protection member and in which connection electrodes of the plurality of solar cells are electrically connected to each other by wiring member.

BACKGROUND ART

Conventionally, in a HIT solar cell module, bus bar electrodes 20 of a plurality of solar cells are electrically connected to each other by wiring members 40 made of a conductive material such as copper foil, as shown in FIG. 1. The plurality of solar cells are sealed in a translucent sealing member made of EVA or the like between a translucent front surface protection member and a back surface protection member. The front surface protection member is made of glass, translucent plastic or the like. The back surface protection member is a film of polyethylene terephthalate (PET) or the like.

In manufacturing the solar cells, bus bar electrodes 20 and finger electrodes 30 are formed on surfaces of each photoelectric conversion body 10 by use of a conductive paste. Then, in general, wiring members 40 are solder-bonded on the bus bar electrodes 20 to connect the solar cells in series (see, for example, Japanese Patent Publication No. 2005-217148).

How to perform the soldering will be described with reference to FIG. 2. FIG. 2 is a cross-sectional view taken along the line A-A of FIG. 1.

Each wiring member 40 is made of a metal material, such as copper foil, completely coated with a solder plating 90 in advance. When the wiring member 40 is soldered to the bus bar electrode 20 made of a silver paste, flux is applied to any of a surface of the bus bar electrode 20 and a surface, which faces a solar cell, of the wiring member 40. Then, the wiring member 40 is provided on the surface of the bus bar electrode 20, and heated. In this heating, the wiring member 40 is soldered to be fixed to the bus bar electrode 20 by alloying a solder portion of the wiring member 40 and the silver paste to form an alloy layer 50 while removing an oxide layer on the surface of the bus bar electrode 20 by using the flux.

DISCLOSURE OF THE INVENTION

The conventional technique described above, however, has a problem that energy output of the solar cell module is reduced through a temperature cycle test (JIS C8917), which is a reliability test. One reason for this reduction in output is an increase in contact resistance due to the destruction of the conductive paste portion such as destruction of the conductive paste (bus bar electrode), peeling at an interface between the conductive paste and the photoelectric conversion body, and peeling at an interface between the conductive paste and the alloy layer.

Presumably, this phenomenon is caused by the following factors. In the solar cell module with a conventional structure shown in FIG. 2, the thermal expansion coefficient of the wiring member is approximately $1.7 \times 10^{-6}/°C.$ (Cu), whereas the thermal expansion coefficient of the photoelectric conversion body is approximately $3.6 \times 10^{-6}/°C.$ (Si). To put it differently, these thermal expansion coefficients differ by a factor of approximately 5. Thus, when the solar cell module is subjected to temperature cycles, the conductive paste located between the wiring members and the photoelectric conversion bodies is subjected to stress. Further, continuous temperature cycles result in accumulation of damage in the conductive paste portions. This is considered to destruct the conductive paste portions, which leads to the increase in contact resistance. Such destruction of the conductive paste due to stress may be caused by an increased proportion of metal particles in the conductive paste. Specifically, suppose that the proportion of the metal particles is made larger to reduce the electrical resistance of the conductive paste as much as possible. This condition weakens adhesion between the metal particles, adhesion between the conductive paste and the alloy portion, and adhesion between the conductive paste and the photoelectric conversion body. Such a problem may occur not only in the solar cell module with a HIT structure, but also in the case where the difference is large between the thermal expansion coefficient of a base material of the photoelectric conversion body and the thermal expansion coefficient of a core material of the wiring member.

Therefore, in view of the above-described problem, an object of the present invention is to provide a solar cell module having a less reduced module output and an improved reliability.

An aspect of the present invention is a solar cell module in which a plurality of solar cells are arranged between a front surface protection member and a back surface protection member and in which connection electrodes of the plurality of solar cells are electrically connected to each other by a wiring member. The solar cell module includes an adhesive layer made of a resin containing a plurality of conductive particles and provided between each of the connection electrodes and the wiring member. Each of the connection electrodes and the wiring member are electrically connected by the plurality of conductive particles, and the resin covers a side surface of each of the connection electrodes and configured to bond the wiring member with a surface of the corresponding solar cell.

In the solar cell module according to the aspect of the present invention, it is possible to suppress output reduction of the module and thus to improve reliability thereof, since the resin having a highly flexibility bonds not only the connection electrodes and the wiring member but also the solar cells and the wiring member.

In the solar cell module according to the aspect of the present invention, each of the connection electrodes may be a bus bar electrode, and the adhesive layer may be provided between the wiring member and a connecting portion of a finger electrode where the finger electrode is connected to the bus bar electrode.

In the solar cell module, it is possible to bond the finger electrodes and the wiring members, and thus to further improve adhesion.

In the above-described solar cell module, the finger electrode and the wiring member may be electrically connected by the plurality of conductive particles.

In the solar cell module, it is possible to establish electrical connection to the wiring member by the finger electrode, even if the connection between the bus bar electrode and the finger electrode is disconnected.

In the solar cell module according to the aspect of the present invention, the plurality of conductive particles may be included at a volume fraction of 3 to 20% in the resin arranged on the side surface of the connection electrode.

In the solar cell module, it is possible to reduce internal stress in a region adjacent to the side surface.

In the solar cell module according to the aspect of the present invention, a surface of the connection electrode may have uneven shape, and projected portions may be in contact with the wiring member.

In the solar cell module, it is possible to preferably improve the electrical connection between the connection electrode and the wiring member, since a portion of the connection electrode is in contact with the wiring member.

In the solar cell module according to the aspect of the present invention, the resin included in the adhesive layer may be a same resin as a resin material used in the connection electrode.

In the solar cell module, it is possible to achieve a good bonding compatibility between the connection electrode and the adhesive layer, thus to further strengthen adhesion.

According to the present invention, it is possible to provide a solar cell module having a less reduced module output and an improved reliability.

BEST MODES FOR CARRYING OUT THE INVENTION

Hereinafter, embodiments of the present invention will be described with reference to the drawings. In the following description on the drawings, identical or similar components are denoted by identical or similar reference symbols. It should be noted, however, that the drawings are schematic, and that the dimensional proportions and the like are different from their actual values. Accordingly, specific dimensions and the like should be inferred on the basis of the description given below. Moreover, dimensional relationships and dimensional proportions may be different from one drawing to another in some parts.

(Solar Cell Module)

Figure 1:
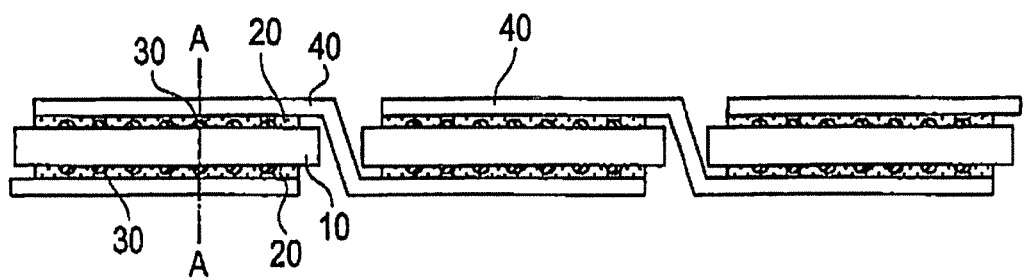
FIG. 1 is a cross-sectional view of conventional solar cells.
Figure 2:
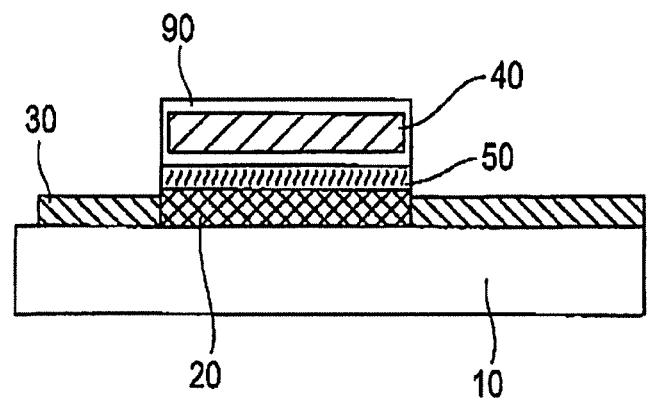
FIG. 2 is an enlarged cross-sectional view of the conventional solar cell.
Figure 3:
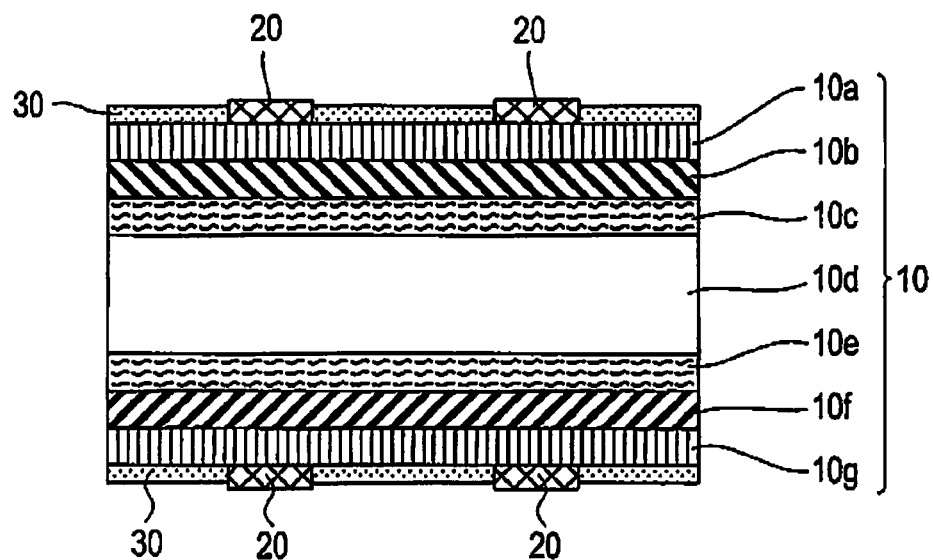
FIG. 3 is a cross-sectional view of a solar cell according to a present embodiment.
Figure 4:
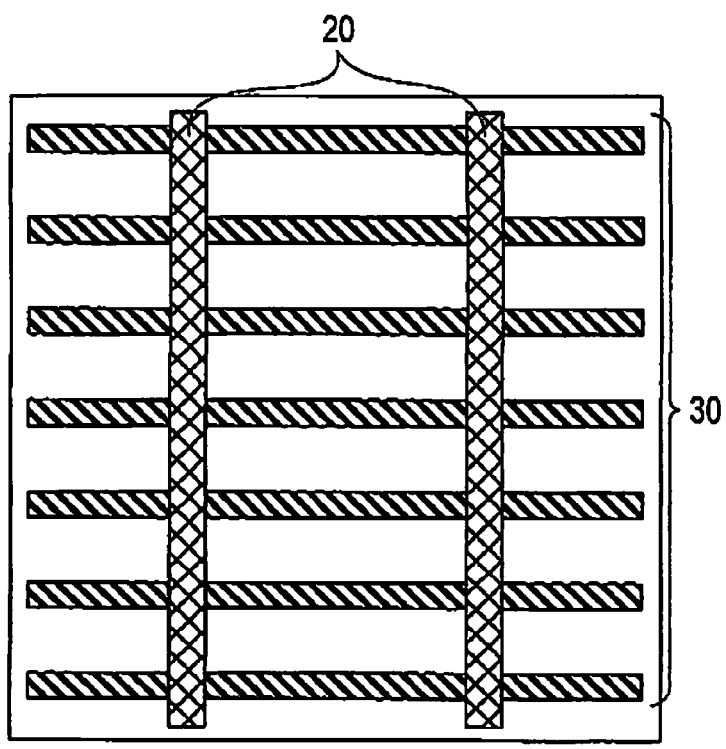
FIG. 4 is a top view of the solar cell according to this embodiment.

As an example of a solar cell according to the present embodiment, a solar cell with a HIT structure will be described below. FIG. 3 is a cross-sectional view of the solar cell according to this embodiment. FIG. 4 is a top view of the solar cell according to this embodiment.

As shown in FIG. 3, in the solar cell according to this embodiment, a p type amorphous silicon layer 10b is formed on the top surface side of an n type single crystal silicon substrate 10d with an i type amorphous silicon layer 10c interposed therebetween. In addition, an ITO film 10a is formed on the p type amorphous silicon layer 10b. On the other hand, an n type amorphous silicon layer 10f is formed on the bottom surface side of the n type single crystal silicon substrate 10d with an i type amorphous silicon layer 10e interposed therebetween. Further, an ITO film 10g is formed on the n type amorphous silicon layer 10f. On the ITO films 10a and 10g, collecting electrodes each formed of bus bar electrodes 20 and finger electrodes 30 are formed as shown in FIG. 3 and FIG. 4. Each collecting electrode is formed of a thermosetting conductive paste containing an epoxy resin as a binder and silver particles as a filler. In this way, the solar cell includes a photoelectric conversion body 10 and the collecting electrodes which are formed on the photoelectric conversion body 10, and each of which is formed of the bus bar electrodes 20 and the finger electrodes 30.

Meanwhile, in a solar cell module according to this embodiment, the bus bar electrodes 20 of the plurality of solar cells are electrically connected to each other by wiring members made of conductive members such as copper foil. The plurality of solar cells electrically connected to each other are sealed in a translucent sealing member made of EVA or the like between a translucent front surface protection member and a back surface protection member. The front surface protection member is made of glass, translucent plastic, or the like. The back surface protection member is a film of PET or the like.

Next, bonding of the bus bar electrodes 20 and the wiring members 40 in the solar cell module according to this embodiment will be described in detail.

Figure 5:
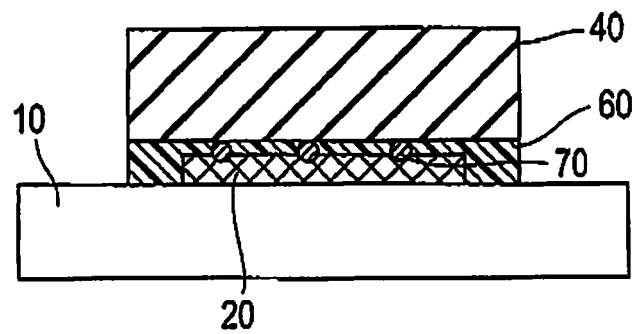
FIG. 5 is an enlarged cross-sectional view of the solar cell according to this embodiment (No. 1).

The solar cell module according to this embodiment includes an adhesive layer formed of a resin 60 containing a plurality of conductive particles 70 between the bus bar electrode 20 and the wiring member 40, as shown in FIG. 5. The bus bar electrode 20 and the wiring member 40 are electrically connected by the conductive particles 70. Meanwhile, the resin 60 covers the side surface of the bus bar electrode 20, and bonds the wiring member 40 with a surface of the photoelectric conversion body 10. Note that the wiring member 40 is made of a metal material, such as copper foil, completely plated with tin.

The resin 60 is, for example, a thermosetting epoxy resin. The conductive particles 70 are for example nickel. In FIG. 5, a row of the nickel particles are interposed between the bus bar electrode 20 and the wiring member 40. The bus bar electrode 20 and the wiring member 40 are electrically connected by the row of the nickel particles. Note that, in FIG. 5, the row of the nickel particles electrically connect the bus bar electrode 20 to the wiring member 40; however, continuously formed a plurality of rows of the nickel particles may electrically connect the bus bar electrode 20 to the wiring member 40.

As the conductive particles 70, at least one kind of electro-conductive metal particles selected from the group consisting of copper, silver, aluminum, nickel, tin, gold, and the like; alloy particles thereof; mixed metal particles thereof; or the like can be used. Alternatively, particles obtained by coating at least one inorganic oxide selected from the group consisting of alumina, silica, titanium oxide, glass, and the like, with a metal may be used. Particles obtained by coating at least one selected from the group consisting of an epoxy resin, an acrylic resin, a polyimide resin, a phenol resin, a urethane resin, a silicone resin, and the like; a copolymer thereof; a mixture thereof; or the like with a metal may be used. In addition, schemes for enhancing electric conductivity can be applied for the shape of the conductive particles 70: for example, mixing of flake-shaped particles and spherical particles; mixing of different sized particles; and provision of uneven shape on the surfaces.

Meanwhile, it is preferable that the resin 60 for completely coating the bus bar electrode 20 be a material more flexible than a material used for the wiring member 40 in order to reduce stress of the wiring member 40 due to expansion and contraction in temperature cycle. Further, in consideration of performing the bonding of the wiring member 40 at the same time, a thermosetting resin material is preferably used as the resin 60. In addition, for keeping the reliability, the resin 60 needs to have excellent moisture resistance and thermal resistance. A resin that satisfies these requirements and thus is usable herein is, for example: a resin selected from the group consisting of an epoxy resin, an acrylic resin, a polyimide resin, a phenol resin, a urethane resin, a silicone resin, and the like; or a mixture thereof; a copolymer thereof; or the like.

Further, in consideration of bonding compatibility with the bus bar electrode 20, the resin 60 is preferably the same resin as the resin material used for the bus bar electrode 20. In addition, from the view point of being curable at a low temperature and in a short period, an epoxy resin or an acrylic resin is preferably used for manufacturing. The resin 60 also may be a film shaped, and capable of being welded by heat.

Figure 6:
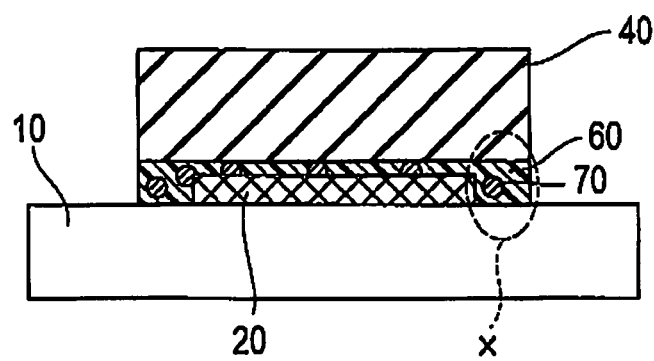
FIG. 6 is an enlarged cross-sectional view of the solar cell according to this embodiment (No. 2).

As for the proportion of the resin 60 and the conductive particles 70, the conductive particles 70 are preferably 70 wt % or more relative to the resin 60, in consideration of electric conductivity. In addition, the conductive particles 70 are preferably included in the resin arranged on the side surface of the bus bar electrode 20 (the portion being designated by X in FIG. 6) as shown in FIG. 6 at a volume fraction of 3 to 20%. This volume fraction can be calculated from an area percentage of the conductive particles 70 in the resin observed by cross-section SEM.

Figure 7:
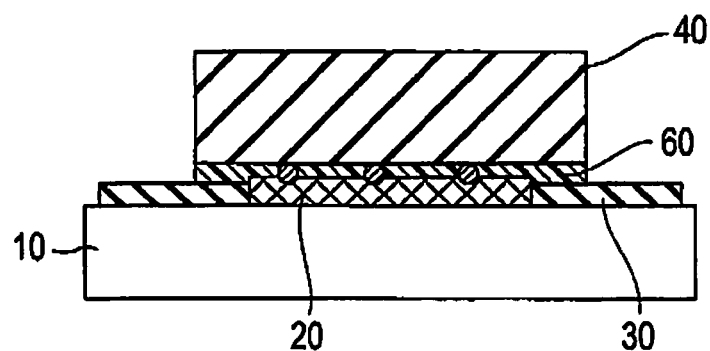
FIG. 7 is an enlarged cross-sectional view of the solar cell according to this embodiment (No. 3).
Figure 8:
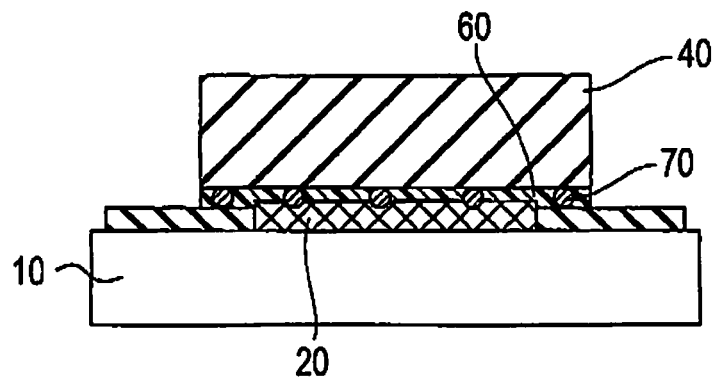
FIG. 8 is an enlarged cross-sectional view of the solar cell according to this embodiment (No. 4).

In the solar cell according to this embodiment, as shown in FIG. 7, the adhesive layer may be provided between the wiring member 40 and a connecting portion to the bus bar electrode 20 of the finger electrode 30 that is connected to the bus bar electrode 20. Meanwhile, as shown in FIG. 8, the finger electrode 30 and the wiring member 40 may be electrically connected by the conductive particles 70.

Figure 9:
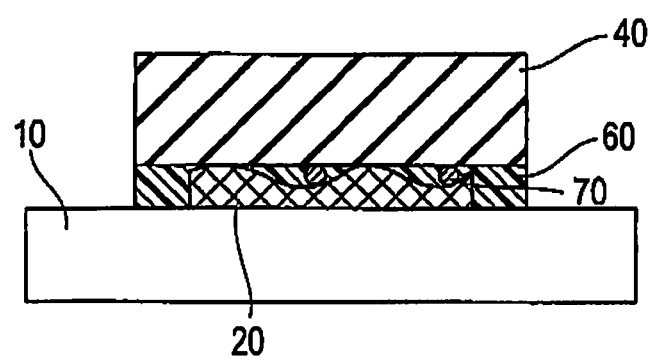
FIG. 9 is an enlarged cross-sectional view of the solar cell according to this embodiment (No. 5).

In the solar cell according to this embodiment, as shown in FIG. 9, a surface of the bus bar electrode 20 may have uneven shape, and the projected portions may be in contact with the wiring member 40.

(Advantages and Effects)

In the solar cell module according to this embodiment, the highly flexible resin 60 bonds the bus bar electrodes 20 and the wiring members 40. In addition, the resin 60 also bonds the photoelectric conversion bodies 10 and the wiring members 40. Thus, stress caused due to difference in the linear expansion coefficients between the wiring member 40 and the photoelectric conversion body 10 can be reduced by the resin 60. For this reason, it is possible to suppress destruction of the conductive paste (bus bar electrode), peeling at the interface between the conductive paste and the photoelectric conversion body, and peeling at the interface between the conductive paste and the alloy layer. As a result, it is possible to prevent the increase in contact resistance due to the destruction of the conductive paste portion, and thereby suppress the reduction in module output. Therefore, the reliability of the solar cell module can be improved.

Meanwhile, in conventional techniques, since an extending direction of the bus bar electrode 20 and an extending direction of the finger electrode 30 cross perpendicularly, stress is applied to the intersection of the these electrodes. Thus, when this intersection portion is destructed, contact failure between the bus bar electrode 20 and the finger electrode 30 occurs, thereby causing reduction in module output. In this embodiment, the adhesive layer is provided between the wiring member 40 and the connecting portion to the bus bar electrode 20 of the finger electrode 30 that is connected to the bus bar electrode 20. For this reason, the finger electrode 30 and the wiring member 40 can be bonded, thereby further improving the adhesion.

In addition, the finger electrode 30 and the wiring member 40 are electrically connected by the conductive particles 70. Accordingly, even if the connection between the bus bar electrode 20 and the finger electrode 30 is disconnected, electrical connection to the wiring member 40 can be established through the finger electrode 30.

In addition, in a resin region disposed on the side wall of the bus bar electrode 20, residual internal stress exists due to contraction of the resin in curing. This stress is likely to cause peeling at the interface between the wiring member 40 and the resin 60. In this embodiment, the conductive particles 70 are included in the resin disposed on the side surfaces of the bus bar electrode 20 at a volume fraction of 3 to 20%. For this reason, in the regions adjacent to the side surfaces, the internal stress in the resin can be reduced. In other words, the conductive particles 70 interrupts bonding between molecules of the resin 60, and thus the contraction of the resin in curing is suppressed. As a result, the residual stress in the resin can be reduced.

In addition, in this embodiment, the surface of the bus bar electrode 20 may have uneven shape, and the projected portions may be in contact with the wiring member 40. This contact between the portions of the bus bar electrode 20 and the wiring member 40 can provide an excellent electrical connection between the bus bar electrode 20 and the wiring member 40.

In addition, the resin included in the adhesive layer provided between the bus bar electrode 20 and the wiring member 40 is preferably the same resin as the resin material used for the bus bar electrode 20. With such resin composition, the bonding compatibility between the bus bar electrode 20 and the adhesive layer is improved, which further strengthens adhesion.

(Method for Producing Solar Cell Module)

Next, a method for producing a solar cell module according to this embodiment will be described.

First, a method for producing the photoelectric conversion body 10 is the same as a conventional method; accordingly, description thereof will be omitted. Next, as shown in FIG. 3, the bus bar electrodes 20 and the finger electrodes 30 are formed on the photoelectric conversion body 10 by use of an epoxy based thermosetting silver paste. Specifically, the silver paste is screen-printed on a light-receiving surface of the photoelectric conversion body 10, and then heated at 150° C. for 5 minutes to preliminarily cure the silver paste. Next, that silver paste is screen-printed on a back surface side of the photoelectric conversion body 10, and then heated at 150° C. for 5 minutes to preliminarily cure the silver paste. Thereafter, the silver pastes are completely cured by being heated at 200° C. for 1 hour. As a result, a solar cell is produced.

Next, by using a dispenser, an epoxy resin containing nickel particles at approximately 5% by volume is applied on the bus bar electrode 20 in a thickness of approximately 30 μm and is applied so as to cover each side surface of the bus bar electrode 20 at approximately 100 μm, as shown in FIG. 5

The resin is applied to the both surfaces of the light receiving surface side and back surface side of each of the plurality of solar cells. Thereafter, wiring members 40 are arranged on the applied resins, respectively. The wiring members 40 on the light receiving surface side and the back surface side are heated at 200° C. for 1 hour, while being pressured toward the solar cell at approximately 2 MPa, to form a string.

Next, a plurality of strings are electrically connected. Thereafter, a glass, a seal sheet, a plurality of strings, a seal sheet, and a back-surface sheet are stacked in this order to form a laminated body. Next, this laminated body is thermo compression bonded at 150° C. for 10 minutes under a vacuum atmosphere to perform preliminarily compression bonding. Thereafter, the laminated body is heated at 150° C. for 1 hour to completely cure the sealing members. Then, a terminal box and a metal frame are attached to the laminated body to produce a solar cell module.

Note that, in the above description, an epoxy resin is applied to the bus bar electrode 20, and the wiring member 40 is arranged on the resin; however, a resin film including the metal particles may be arranged on the bus bar electrode 20, and the wiring member 40 is arranged on the resin film to form the string.

Other Embodiments

Although the present invention has been described on the basis of the aforementioned embodiment, it should not be understood that the descriptions and drawings that constitute parts of this disclosure limit the invention. Various alternative embodiments, examples, and operation technologies will be apparent to those skilled in the art from this disclosure.

For example, the present invention, of course, is not limited to the structure described in the above-described embodiment, since the present invention is to solve a problem arising when a difference exists in linear expansion coefficient between the base material of the photoelectric conversion bodies 10 and the core material of wiring members 40 for connecting the plurality of solar cells. For example, the present invention can be applied to the following case also. Specifically, a material having a relatively low linear expansion coefficient such as a Si substrate made of single crystal Si, polycrystalline Si or the like, a stainless substrate, or a glass substrate is used as the substrate of the photoelectric conversion body 10. On the substrate, various photoelectric conversion layers are formed by a method such as a thermal diffusion method, a plasma CVD method, or the like. On the photoelectric conversion body, an electricity extraction mechanism is formed by use of a conductive paste. On the conductive paste, a lead wire including a core material which is a material having a relatively high linear expansion coefficient such as copper, silver, aluminum, nickel, tin, gold, or alloy thereof is bonded. The present invention can also be applied to a solar cell with such a structure.

Hence, it is obvious that the present invention includes various embodiments and the like not described herein. Accordingly, the technical scope of the present invention should only be defined by the claimed elements according to the scope of claims reasonably understood from the above description.

EXAMPLES

Hereinafter, a thin-film solar cell module according to the present invention will be specifically described by way of Examples. The present invention, however, is not limited to the following Example, and thus can be carried out by making appropriate changes without departing from the scope of the invention.

Example 1

As a solar cell according to Example 1 of the present invention, a solar cell shown in FIG. 3, FIG. 4, and FIG. 6 was produced as follows. In the following production method, the process will be divided into steps 1 to 4, and described.

<Step 1> Producing Photoelectric Conversion Body

First, as shown in FIG. 3, an n type single crystal silicon substrate 10*d* having a thickness of approximately 300 μm and an electrical resistivity of approximately 1 Ω·cm was prepared by cleaning the substrate to remove impurities. Next, using a RF plasma CVD method, an i type amorphous silicon layer 10*c* having a thickness of approximately 5 nm and a p type amorphous silicon layer 10*b* having a thickness of approximately 5 nm were formed on the top surface of the n type single crystal silicon substrate 10*d* in this order. Note that specific conditions of the RF plasma CVD method for forming the i type amorphous silicon layer 10*c* and the p type amorphous silicon layer 10*b* were as follows: Frequency: approximately 13.65 MHz; Forming Temperature: approximately 100 to 250° C.; Reaction Pressure: approximately 26.6 to 80.0 Pa; and RF Power: approximately 10 to 100 W.

Next, an i type amorphous silicon layer 10e having a thickness of approximately 5 nm and an n type amorphous silicon layer 10f having a thickness of approximately 5 nm were formed on the bottom surface of the n type single crystal silicon substrate 10d in this order. Note that the i type amorphous silicon layer 10e and the n type amorphous silicon layer 10f were formed by the same processes as those for the i type amorphous silicon layer 10c and the p type amorphous silicon layer 10b described above.

Next, by use of a magnetron sputtering method, ITO films 10a and 10g each having a thickness of approximately 100 nm were formed on the p type amorphous silicon layer 10b and the n type amorphous silicon layer 10f, respectively. Specific conditions for forming the ITO films 10a and 10g were as follows: Forming Temperature: approximately 50 to 250° C.; Ar Gas Flow Rate: approximately 200 sccm; $O_2$ Gas Flow rate: approximately 50 sccm; Power: approximately 0.5 to 3 kW; Magnetic Field Strength: approximately 500 to 3000 Gauss.

<Step 2> Forming Collecting Electrode

By use of a screen printing method, an epoxy based thermosetting silver paste was transferred on a predetermined region of the transparent electrode film on the light receiving surface side, and then heated at 150° C. for 5 minutes to be preliminarily cured. Thereafter, the paste was heated at 200° C. for one hour to be completely cured. Accordingly, collecting electrodes each formed of a plurality of finger electrodes 30 and bus bar electrodes 20 were formed on the respective upper surfaces of the transparent conductive layers as shown in FIG. 4. The plurality of finger electrodes 30 were formed so as to extend in parallel with each other at a predetermined pitch. The bus bar electrodes 20 are to gather currents collected by the finger electrodes 30. Here, the bus bar electrodes 20 each had a width of approximately 1.0 mm and a height of approximately 50 μm.

<Step 3> Forming String

Figure 10:
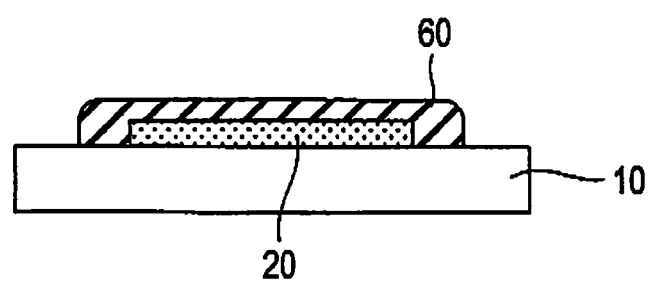
FIG. 10 is a cross-sectional view illustrating a method for producing a solar cell module according to Example 1 (No. 1).
Figure 11:
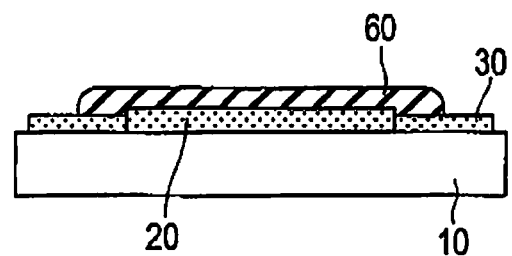
FIG. 11 is a cross-sectional view illustrating the method for producing a solar cell module according to Example 1 (No. 2).

First, by using a dispenser, an epoxy based thermosetting nickel paste was applied on the bus bar electrodes 20. Specifically, as shown in FIG. 10, the nickel paste was applied on each bus bar electrode 20 in a thickness of approximately 30 μm. At this time, the nickel paste was applied so as to cover the outside of side surfaces of the bus bar electrode 20 by approximately 100 μm. At the same time, the nickel paste was applied so as to cover a root portion of the finger electrode 30 as shown in FIG. 11. Note that the nickel paste used herein included nickel particles at a volume fraction of approximately 5%.

Figure 12:
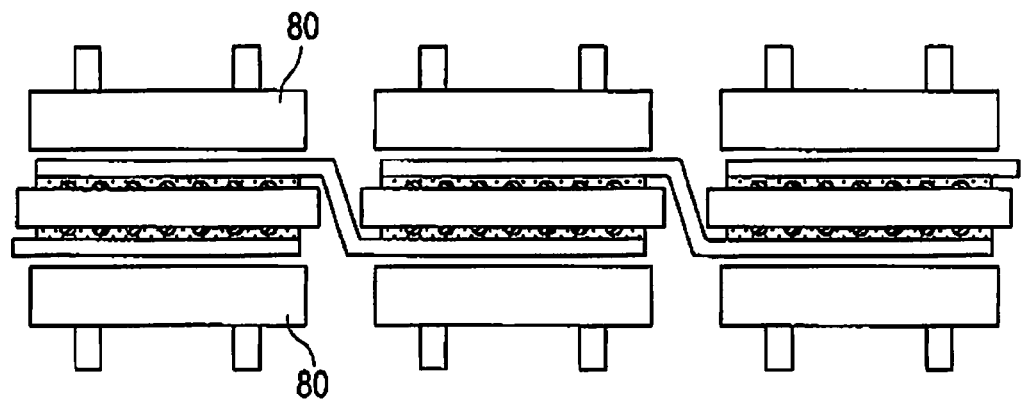
FIG. 12 is a cross-sectional view illustrating the method for producing a solar cell module according to Example 1 (No. 3).
Figure 13:
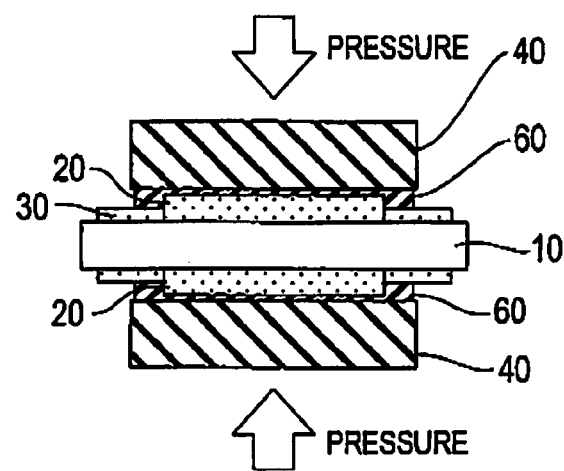
FIG. 13 is a cross-sectional view illustrating the method for producing a solar cell module according to Example 1 (No. 4).

The nickel paste was applied on both the light receiving and back surface sides. Then, tin-plated copper foil having a width of approximately 1.5 mm to serve as a wiring member 40 was arranged on each bus bar electrode 20. Subsequently, as shown in FIG. 12, the plurality of solar cells were arranged so as to be connected to each other. Each solar cell was sandwiched by heaters 80 from the top and bottom of the solar cell. Thereafter, the solar cell was heated at approximately 200° C. for one hour while pressured at 2 MPa. As a result, the nickel paste was cured, and a string was formed. By curing and pressuring the nickel paste in this manner, the nickel particles were sandwiched between the tin-plated copper foil and the bus bar electrode 20. As a result, an excellent electric conductivity was obtained. In addition, the nickel paste was extended by pressure and spread out to have the same width as that of the wiring member 40. In addition, a structure as shown in FIG. 13 was obtained with the nickel paste having a thickness of approximately 20 μm covering the root portion of the finger electrode 30 by a length of approximately 200 μm.

<Step 4> Modularization

A sealing member made of an EVA sheet was arranged on a front surface protection member made of a glass substrate. Then, the plurality of solar cells connected by the wiring members were arranged on the sealing member. Then, another sealing member made of an EVA sheet is arranged thereon, and a back surface protection member having a three-layer structure of PET/aluminum foil/PET was arranged on the sealing member. This laminated body was thermo compression bonded at 150° C. for 10 minutes in a vacuum atmosphere to perform preliminarily compression bonding. Thereafter, the laminated body was heated at 150° C. for 1 hour to completely cure the sealing members. A terminal box and a metal frame were attached to the laminated body to produce a solar cell module according to Example 1.

Comparative Example 1

Figure 14:
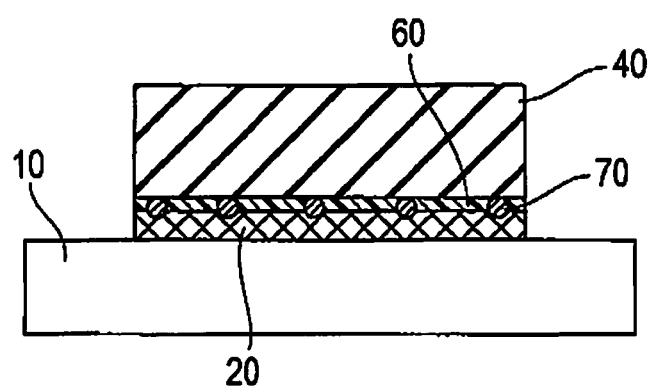
FIG. 14 is an enlarged cross-sectional view of a solar cell according to Comparative Example 1.

As a solar cell according to Comparative Example 1, a solar cell shown in FIG. 14 was produced as follows.

<Step 1> Photoelectric conversion bodies were formed by the same method as that of Example 1.

<Step 2> Collecting electrodes were formed by use of the same method as that of Example 1, in a way that each bus bar electrode 20 had a width of approximately 1.5 mm.

<Step 3> In Comparative Example 1, each solar cell string was formed in a way that each adhesive layer did not extend beyond the bus bar electrode 20.

Figure 15:
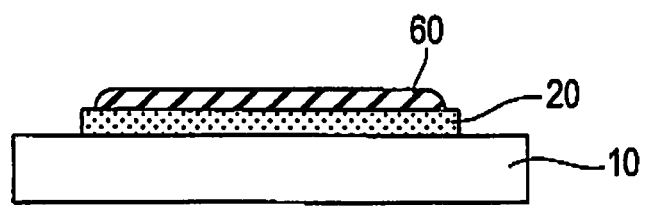
FIG. 15 is a cross-sectional view illustrating a method for producing a solar cell module according to Comparative Example 1.

First, by using a dispenser, an epoxy based thermosetting nickel paste was applied on the bus bar electrodes 20. Specifically, as shown in FIG. 15, the nickel paste was applied on each bus bar electrode 20 in a way that the nickel paste had a width of approximately 1.2 mm and a thickness of approximately 30 μm. Note that the nickel paste used herein included nickel particles at a volume fraction of approximately 5%.

The nickel paste was applied on both the light receiving and back surface sides. Then, tin-plated copper foil having a width of approximately 1.5 mm to serve as a wiring member 40 was arranged on each bus bar electrode 20. Subsequently, as shown in FIG. 12, the plurality of solar cells were arranged so as to be connected to each other. Each solar cell was sandwiched by heaters 80 from the top and bottom of the solar cell. Thereafter, the solar cell was heated at approximately 200° C. for one hour while pressured at 2 MPa. As a result, the nickel paste was cured, and the string was formed. By curing and pressuring the nickel paste in this manner, the nickel particles were sandwiched between the tin-plated copper foil and the bus bar electrode 20. As a result, an excellent electric conductivity was obtained. In addition, the nickel paste was extended by pressure and spread out to have almost the same width as that of the wiring member 40.

<Step 4> A solar cell module was produced by the same method as that of Example 1.

Comparative Example 2

As a solar cell according to Comparative Example 2, a solar cell with conventional solder-bonding was produced as follows.

<Step 1> Photoelectric conversion bodies were formed by the same method as that of Example 1.

<Step 2> Collecting electrodes were formed by use of the same method as that of Example 1, in a way that each bus bar electrode 20 had a width of approximately 1.5 mm.

<Step 3> Copper foil plated with Sn—Ag—Cu solder having a width of approximately 1.5 mm to serve as a wiring member 40 was arranged on each bus bar electrode 20. Next, as shown in FIG. 12, the plurality of solar cells were arranged so as to be connected to each other. Then, the bus bar electrode 20 and the wiring member 40 were solder-bonded to form a string.

<Step 4> A solar cell module was produced by the same method as that of Example 1.

(Evaluation Method)

A temperature cycle test (JIS C8917) was conducted on each of the solar cell modules according to Example 1 and Comparative Examples 1 and 2. Comparison of energy output of solar cell module before and after the test, cross-section observation of a wiring member connecting portion, and comparison of light emission by an electroluminescence method were conducted. According to this JIS standard, durability is specified as an output change ratio after 200 cycles. However, in this time, a 400-cycle test was conducted in order to evaluate longer-term durability. The output of the solar cell module was measured under light irradiation of AM1.5 and 100 mW/cm$^2$.

Figure 16:
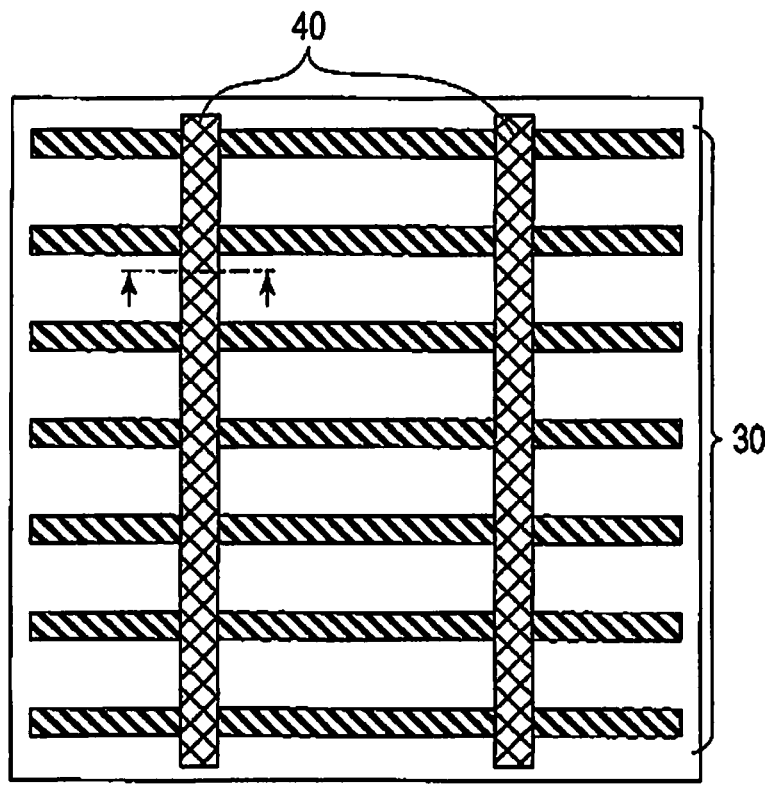
FIG. 16 is a top view of a solar cell according to Example 1.

As for the cross-section observation, a cross-section was taken along a plane designated by the arrows shown in FIG. 16 and observed by SEM. Ten sites were observed for each sample.

The electroluminescence method was carried out with reference to "Characterization of Polycrystalline Silicon Solar Cells by Electroluminescence (PVSEC-15, Shanghai, China: October 2005.)" Specifically, a current of approximately 2 A was injected to each solar cell module, and infrared emission at that time was observed by a CCD camera. With this method, emission is weak in a region where current is less likely to flow due to a high resistance to the current or a region where a diffusion length of the minor carriers is small. Thus, such a region appears as a dark region.

(Experiment Results)

Table 1 shows normalized output reduction ratios obtained by the temperature cycle test.

TABLE 1

|  | Example 1 | Comparative Example 1 | Comparative Example 2 |
| --- | --- | --- | --- |
| Normalized output reduction ratio | 0.40 | 0.90 | 1.00 |
| Bus bar cross-section SEM image | ○ | x | x |
| EL emission | ○ | x | x |

Each output reduction ratio was calculated using the following formula: (1−output after test/output before test)× 100(%), and normalized with the output reduction ratio in Comparative Example 2 taken as 1.00. As shown in Table 1, it is found out that the normalized output reduction ratio in Example 1 is smaller than those in Comparative Examples 1 and 2.

Figure 17:
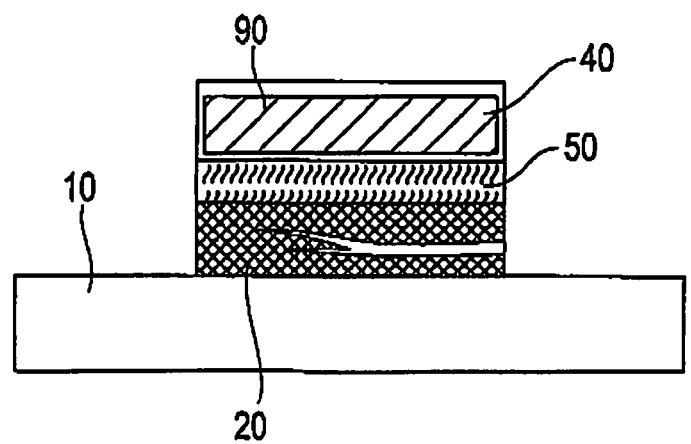
FIG. 17 is an enlarged cross-sectional view of a solar cell according to Comparative Examples 1 and 2 after a temperature cycle test.

In addition, as a result of the cross-section SEM observation, no particular abnormalities were observed in the samples before the temperature cycle test; however, cracks as shown in FIG. 17 were observed in the samples of Comparative Examples 1 and 2, after the temperature cycle test. On the other hand, in Example 1, no crack was observed. In Table 1, a sample with no observable crack is represented by a "○" sign, and a sample with any observable crack is represented by a "x" sign.

Figure 18:
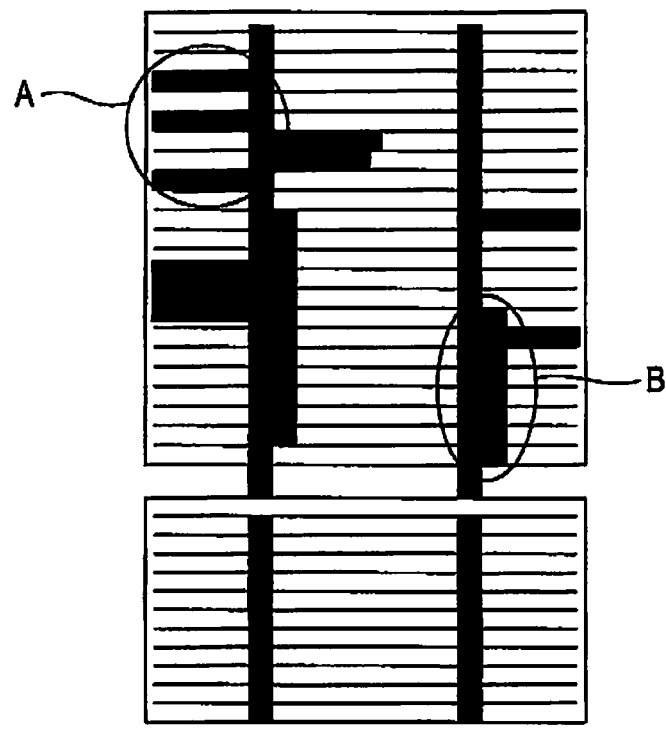
FIG. 18 is a top view of the solar cell according to Comparative Examples 1 and 2 after a temperature cycle test.

In addition, as a result of the observation of emission according to the electroluminescence method, no particular abnormalities were observed in the samples before the temperature cycle test; however, dark regions as shown in FIG. 18 were observed in the samples of Comparative Examples 1 and 2, after the temperature cycle test. On the other hand, in Example 1, such a dark region was not observed even after the temperature cycle test. In Table 1, a sample in which no dark region appeared is represented by a "○" sign, and a sample in which any dark region appeared is represented by a "x" sign.

(Observation)

In Comparative Examples 1 and 2, a crack was observed in the bus bar electrode 20 after the temperature cycle test. Further, in Comparative Examples 1 and 2, a dark region was observed in the emission test according to the electroluminescence method after the temperature cycle test. The dark regions as shown in a portion A of FIG. 18 appearing along the finger electrodes 30 presumably means that emission according to the electroluminescence method was weak since a circuit was broken at a root portion of each finger electrode 30 (i.e., at a connecting portion to the corresponding bus bar electrode), making it difficult for a current to flow from the root of the finger electrode 30 to the tip end thereof. Meanwhile, the dark regions as shown in a portion B appearing along the bus bar electrode 20 were presumably due to the crack in the bus bar electrode 20 also observed by the cross-section SEM. Such a crack was presumably formed because of damage accumulated in the bus bar electrode located between the wiring member and the silicon substrate having linear expansion coefficients greatly different from each other, as a result of repetition of the temperature cycle test. In other words, as a result of the temperature cycle test, the two kinds of damage described above were caused in the collecting electrodes of Comparative Examples 1 and 2. Such damage in the collecting electrode presumably caused reduction in output.

On the other hand, in Example 1, neither cracks in the bus bar electrode 20 nor dark regions according to the electroluminescence method were observed. In addition, in Example 1, output reduction due to the temperature cycle test was greatly diminished. In other words, in Example 1, since each bus bar electrode 20 was covered with a resin region and thus reinforced, cracks in the bus bar electrode 20 to be caused by the temperature cycle were suppressed. In addition, in Example 1, since the root portion of each of the finger electrodes 30 was covered with the resin region, breaking of circuit in the root portion of the finger electrode caused by the temperature cycle was suppressed. Presumably because of the suppression, the output reduction due to the temperature cycle test was greatly diminished.

(Experiment on Density of Conductive Particles)

Next, effects of change in the amount of the conductive particles were investigated.

Samples among which kinds of conductive particles and densities of the conductive particles in the resin region were varied were produced by the same method as that in Example 1 described above.

Two kinds, silver and nickel, of conductive particles were prepared. The average diameters of these kinds of conductive particles were 10 µm. Particle amounts in the resin were adjusted within a volume fraction range from 0 to 50%. If the volume fraction of particles exceeds 50%, adhesion performance of the resin is remarkably decreased. Thus, the volume fraction was set within a range from 0 to 50%.

Each of the solar cell modules produced as described above was subjected to the temperature cycle test (JIS C8917) to measure energy outputs of the solar cell module before and after the test. Then, the output reduction ratios were compared. The outputs of the solar cell module were measured under light irradiation of AM1.5 and 100 mW/cm$^2$.

(Experiment Results and Observation)

Figure 19:
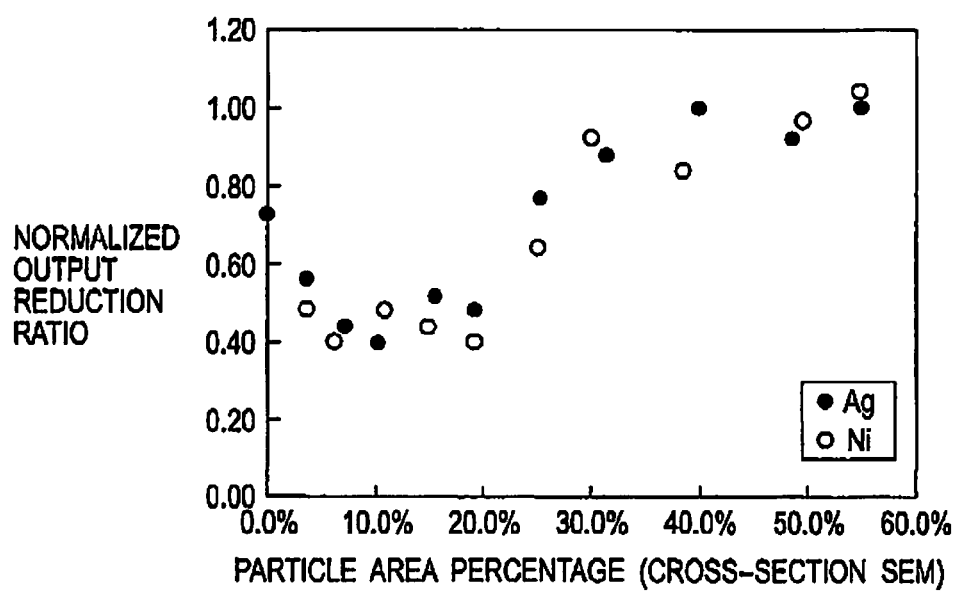
FIG. 19 is a graph showing experiment results of solar cells according to Example 1 among which kinds of conductive particles and densities thereof are varied.

In FIG. 19, the horizontal axis represents the area percentage of the conductive particles observed by cross-section SEM of the resin component. Meanwhile, the vertical axis represents the normalized output reduction ratio. Each area percentage of the conductive particles was calculated as a percentage of the section of the conductive particles occupying in a region (portion X in FIG. 6) outside the side surface of the bus bar electrode, the section being observed by the cross-section SEM. The output reduction ratios were calculated using the following formula: (1−output after test/output before test)×100(%), and normalized with the output reduction ratio in Comparative Example 2 taken as 1.00.

As shown in FIG. 19, when the particle area percentages in the resin region were 30% or more, the normalized output reduction ratios obtained due to the temperature cycle was the same as that in Comparative Example 2. On the other hand, when the particle area percentages in the resin region were 25% or less, it is found out that the normalized output reduction ratios due to temperature cycle are smaller than that in Comparative Example 2. This is presumably because, when the particle area percentage in the resin region is 30% or more, bulk bonding force is relatively low as similar to a bus bar electrode region in which conductive particles are densely present, and thus a crack is likely to be formed by stress due to the temperature cycle. Presumably because the bus bar electrodes were coated with such a resin having a strong bonding force, a reinforcing effect on the bus bar electrode was obtained.

In addition, it is understood that, within a range where the particle area percentage in the resin region is 3 to 20%, the effect to suppress output reduction due to the temperature cycle was further increased. This is presumably because, when the particle area percentage in the resin region is large (25% or more), the bulk bonding force is weak as described above, and thus a crack is likely to be formed by stress due to the temperature cycle. Presumably, as a result of this, tendency to cause output reduction due to the temperature cycle test was observed. On the other hand, when the particle area percentage in the resin region is small (0%), contraction stress generated in curing is great, and thus peeling at the interface between the resin and the wiring member or the photoelectric conversion body is presumably likely to occur. Presumably, as a result of this, tendency to cause output reduction due to the temperature cycle test is observed. In other words, by moderately containing the particles in the resin, bonds between the molecules in the resin can be interrupted, and thus the internal stress present in the resin can be reduced. As a result, peeling at the interface between the resin region and the photoelectric conversion body or the interface between the resin region and the wiring member can be suppressed. As described above, the solar cell module with a further excellent durability against temperature cycles can be obtained.

Note that the entire content of Japanese Patent Application No. 2006-265871 (filed on Sep. 28, 2006) is incorporated herein by reference.

INDUSTRIAL APPLICABILITY

As has described above, a solar cell module according to the present invention can achieve an improved reliability by suppressing the reduction in the module output. Therefore, the solar cell module is useful in solar power generation.

The invention claimed is:

1. A solar cell module, comprising:
    a solar cell including:
        a semiconductor photo-electric conversion body having a light incident surface and a back surface opposite to the light incident surface;
        a front bus bar electrode disposed on the light incident surface and extending in a first direction, wherein the front bus bar electrode is continuous throughout its entire length; and
        a plurality of finger electrodes disposed on the light incident surface and extending from the front bus bar electrode in a second direction crossing the first direction; and
    a wiring member disposed over the front bus bar electrode and extending in the first direction; and
    an adhesive layer bonding and fixing the wiring member to the front bus bar electrode and bonding and fixing the wiring member to the light incident surface, wherein:
    the adhesive layer is provided as a distinct element from the wiring member and the front bus bar electrode,
    the adhesive layer includes a resin and a plurality of conductive particles,
    the adhesive layer is disposed between an upper surface of the front bus bar electrode and a bottom surface of the wiring member,
    in a cross section, along the second direction, of the front bus bar electrode between two adjacent finger electrodes, the adhesive layer is in direct contact with the bottom surface of the wiring member, side surfaces of the front bus bar electrode and the light incident surface, and
    the wiring member is electrically connected to the front bus bar electrode by the plurality of conductive particles.

2. The solar cell module of claim 1, wherein, in the cross section of the front bus bar electrode between two adjacent finger electrodes, the adhesive layer completely fills an area between the wiring member and the light incident surface except for the front bus bar electrode.

3. The solar cell module of claim 1, wherein at least one of the plurality of conductive particles is in direct contact with the bottom surface of the wiring member and the upper surface of the front bus bar electrode.

4. The solar cell module of claim 3, wherein at least one of the plurality of conductive particles disposed in an area between the wiring member and the light incident surface except for the front bus bar electrode is fully covered by the resin.

5. The solar cell module of claim 1, wherein:
    the light incident surface includes an ITO layer, and
    the adhesive layer adheres to the ITO layer.

6. The solar cell module of claim 1, wherein, in a cross section, along the second direction, of the front bus bar electrode and one of the plurality of finger electrodes,
    the adhesive layer is disposed between an upper surface of the one of the plurality of finger electrodes and the bottom surface of the wiring member, and
    the adhesive layer adheres to the bottom surface of the wiring member and the upper surface of the one of the plurality of finger electrodes.

7. The solar cell module of claim 6, wherein at least one of the plurality of conductive particles is in direct contact with the bottom surface of the wiring member and the upper surface of the front bus bar electrode.

8. The solar cell module of claim 7, wherein at least one of the plurality of conductive particles is in direct contact with the bottom surface of the wiring member and the upper surface of the one of the plurality of finger electrodes.

9. The solar cell module of claim 1, wherein the wiring member and the solar cell are electrically connected only via the plurality of conductive particles, the front bus bar electrode and the plurality of finger electrodes.

10. The solar cell module of claim 1, wherein:
the upper surface of the front bus bar electrode has projected portions, and
at least one of the projected portions directly contacts the bottom surface of the wiring member.

\* \* \* \* \*